United States Patent [19]
Lee et al.

[11] Patent Number: 5,126,602
[45] Date of Patent: Jun. 30, 1992

[54] DIGITAL PHASE DETECTOR IN AN NRZ BIT SYNCHRONOUS SYSTEM

[75] Inventors: Bhum C. Lee, Dongku; Kwon C. Park, Seogu, both of Rep. of Korea

[73] Assignees: Electronics and Telecommunications Research Institute, Daejeon; Korea Telecommunication Authority, Seoul, both of Rep. of Korea

[21] Appl. No.: 720,920

[22] Filed: Jun. 25, 1991

[30] Foreign Application Priority Data

Jul. 20, 1990 [KR] Rep. of Korea ............. 1990-11070

[51] Int. Cl.$^5$ .................................................. H03K 5/26
[52] U.S. Cl. .................................. 307/510; 307/511; 307/525; 307/527; 307/528; 328/133
[58] Field of Search ............. 307/510, 511, 525–528; 328/133; 375/119, 120

[56] References Cited

U.S. PATENT DOCUMENTS

| | | |
|---|---|---|
| 4,222,009 | 9/1980 | Moulton et al. ............. 328/72 |
| 4,246,497 | 1/1981 | Lawson et al. ............. 307/514 |
| 4,385,395 | 5/1983 | Tanaka et al. ............. 307/528 |
| 4,400,667 | 8/1983 | Belkin ............. 331/1 A |
| 4,422,176 | 12/1983 | Summers ............. 307/527 |
| 4,663,769 | 5/1987 | Krinock ............. 307/527 |
| 4,752,926 | 6/1988 | Goeb ............. 307/510 |
| 4,773,085 | 9/1988 | Cordell ............. 375/120 |
| 4,777,447 | 10/1988 | Mueller ............. 307/525 |
| 5,036,529 | 7/1991 | Shin ............. 375/119 |

*Primary Examiner*—Stanley D. Miller
*Assistant Examiner*—Terry D. Cunningham
*Attorney, Agent, or Firm*—Blakely, Sokoloff, Taylor & Zafman

[57] ABSTRACT

The object of the present invention is to provide a phase detector comprising three D-type flip-flops, which compares the transition phase of retiming clock pulses with the phase of the center of the unit bit interval of received data, produces the compared result in digital fashion to operate irrespective of the data bit speed and in the form of a phase information that is compatible with a digital circuit.

2 Claims, 3 Drawing Sheets

DIGITAL PHASE DETECTOR IN AN NRZ BIT SYNCHRONOUS SYSTEM

BACKGROUND OF THE INVENTION

The present invention relates to a digital phase detector for use in connection with synchronizing the transition of clock pulses for retiming the received NRZ (nonreturn to zero) data at the center of the unit bit interval of the data to be retimed.

Conventionally, a circuit for bit synchronism comprises an open loop-type retiming circuit wherein the transition of a clock pulse extracted from a data is manually adjusted to occur at the center of the unit bit interval of received data. As a result, the transition of the clock pulse extracted from the data can not be placed automatically at the center of the unit bit interval of the data. The circuit also consists of an accurate phase complementary circuit, so that the retiming performance thereof depends upon the accuracy and the temperature chracteristics of the constituting elements. Also, recently developed self-adjusting retiming circuits have a drawback of limiting the data bit-transmitting rate, because they frequently generate jitter and produce a phase information in the form of a pulse width.

SUMMARY OF THE INVENTION

Therefore, an object of the present invention is to overcome the problems encountered in the above-mentioned prior arts and to provide a phase detector which compares the transition phase of the retiming clock pulses with the phase of the center of the unit bit interval of the received data, produces the compared result in digital fashion to operate irrespective of the data bit speed and in the form of a phase information being able to easily match with a digital circuit.

In accordance with the present invention, this object can be accomplished by providing a digital phase detector for bit synchronism comprising: means for producing non-inverted phase clock pulses and inverted phase clock pulses from clock pulses; first retiming means connected to said non-inverted phase and inverted phase clock pulse producing means and adapted to retime the received data with the non-inverted phase clock pulses and the inverted phase clock pulses from the non-inverted phase and inverted phase clock pulse producing means; second retiming means connected to both the non-inverted phase and inverted phase clock pulse producing means and said first retiming means and adapted to retime again with the inverted phase clock pulses the data retimed with the non-inverted phase clock pulses from the non-inverted phase and inverted phase clock pulses producing occurring means; transition-detecting count pulse producing means connected to the first retiming means and adapted to detect the phase discrepancy between the data first retimed with the non-inverted phase clock pulses from the non-inverted phase and inverted phase clock pulses occurring means and the data first retimed with the inverted phase clock pulses from the non-inverted phase and inverted phase clock pulses occurring means, in order to produce pulses each time when the received data is transited; and rising or lowering count pulses producing means connected to said second retiming means and adapted to compare the phase of the data retimed with the second retiming means and the phase of the data first retimed with the inverted phase clock pulses from the non-inverted phase and inverted phase clock pulse producing means, thereby to detect the resulted phase discrepancy, so that the transition phase of the retiming clock pulses can be compared with the phase of the center of the unit bit interval of the received data, thereby causing the result thereof to be provided in digital fashion.

BRIEF DESCRIPTION OF THE DRAWINGS

In order that the invention may be more fully understood, reference will now be made by way of example to the accompanying drawings, in which.

DETAILED DESCRIPTION OF THE PREFERRED EMBODIMENT

Figure 1:
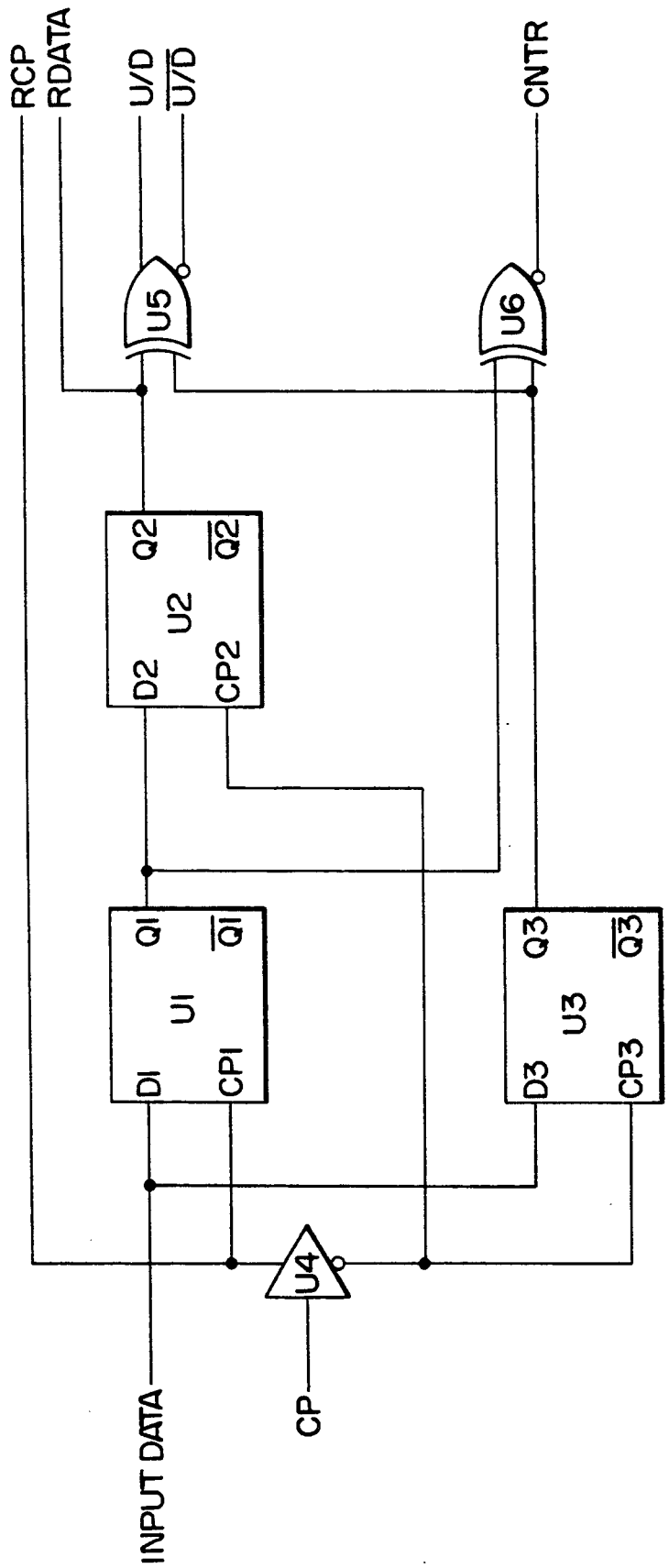
FIG. 1 is a circuit diagram in accordance with an embodiment of the present invention.

Referring to FIG. 1, there is shown an example of digital phase detectors for bit synchronism utilizing emitter-coupled logic (ECL). The detector comprises D-type flip-flops U1, U2, and U3. A NRZ data is received in the data input D1 of the D-type flip-flop U1. The NRZ data is also applied to the data input D3 of the D-type flip-flop U3. The detector also comprises a receiver U4 receiving clock pulses from a VCO (voltage-controlled oscillator) or a phase-controlled circuit to produce inverted and non-inverted phase clock pulses. The non-inverted phase pulses and the inverted phase clock pulses are applied to the clock pulse input CP1 of the D-type flip-flop U1 and the clock pulse input CP3 of the D-type flip-flop U3, respectively, thereby causing the received NRZ data to be first retimed with said pulses. The inverted phase clock pulses are also applied to the clock pulse input CP2 of the D-type flip-flop U2 so that the data retimed with the non-inverted clock pulses is secondly retimed with the inverted phase clock pulses.

Therefore, the retimed data from the output Q1 of the D-type flip-flop U1 is advanced or retarded in phase, by one-half clock pulse period of a clock pulse from the VCO or the phase-controlled circuit, than the retimed data from the output Q3 of the D-type flip-flop U3. An exclusive NOR-gate U6 takes both the data from the D-type flip-flop U1 and the data from the D-type flip-flop U3 in exclusive NOR-fashion, so that it can produce a pulse having one-half clock pulse period of the retiming clock pulses each time when the received NRZ data is transited.

An exclusive OR-or NOR-gate U5 takes both the data from the output Q2 of the D-type flip-flop U2 and the data from the output Q3 of the D-type flip-flop U3 in exclusive OR-or NOR-fashion. The output from the gate U5 depends upon the phase discrepancy between the phase of the transition of the retiming clock pulse and the phase of the center of the bit interval of the received NRZ data.

Now, a digital phase comparator for synchronizing bits in phase with the clock pulse from the VCO or the phase-controlled circuit will be described, with reference to the timing diagrams shown in FIGS. 2A and 2B.

Figure 2A:
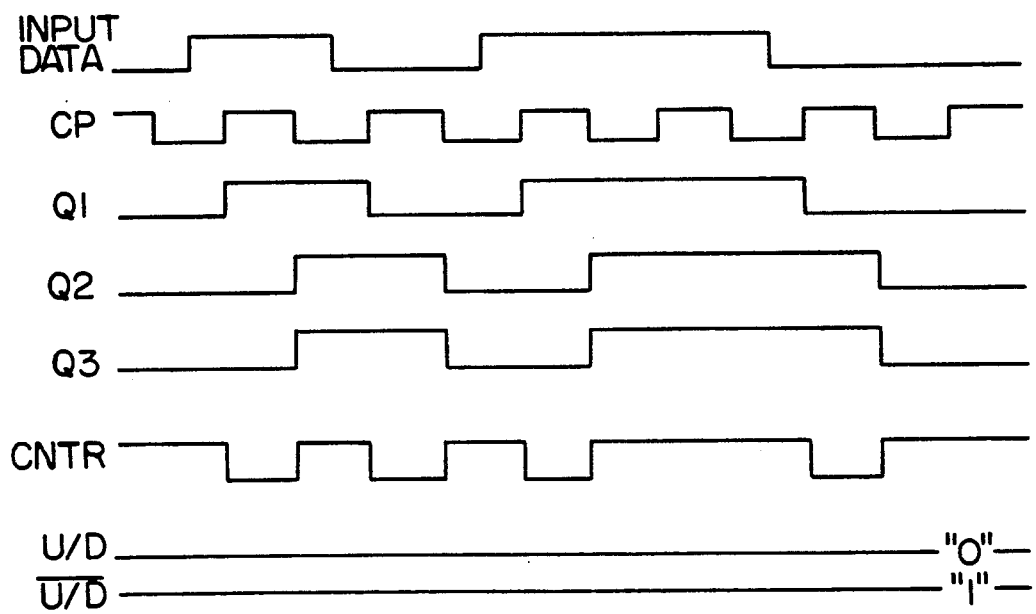
FIGS. 2A and 2B are timing diagrams of the circuit shown in FIG. 1.

First, the upper diagram FIG. 2A shows the case where the transited position of the clock pulse from the VCO or the phase-controlled circuit is advanced relative to the center of the unit bit interval of the NRZ data, that is, where the rising edge of the retiming non-inverted phase clock pulse occurs before the center of the unit bit interval of the NRZ data. At this time, there is no phase discrepancy between the data from the output Q2 of the D-type flip-flop U2 retimed with non-inverted phase clock pulses and then retimed again with inverted phase clock pulses and the data from the output Q3 of the D-type flip-flop U3 retimed with the inverted phase clock pulses, so that the exclusive OR-output U/D from the exclusive OR-or NOR-gate U5 maintains "0" logic level. On the other hand, the phase discrepancy between the data from the output Q1 of the D-type flip-flop U1 retimed with the non-inverted phase clock pulses and the data from the output Q3 of the D-type flip-flop U3 retimed with the inverted phase clock pulses is always one-half a duration of the retiming clock pulses. Accordingly, the exclusive NOR-gate U6 produces "0" logic level pulses with a period interval equal to one-half duration of the retiming clock pulses.

Figure 2B:
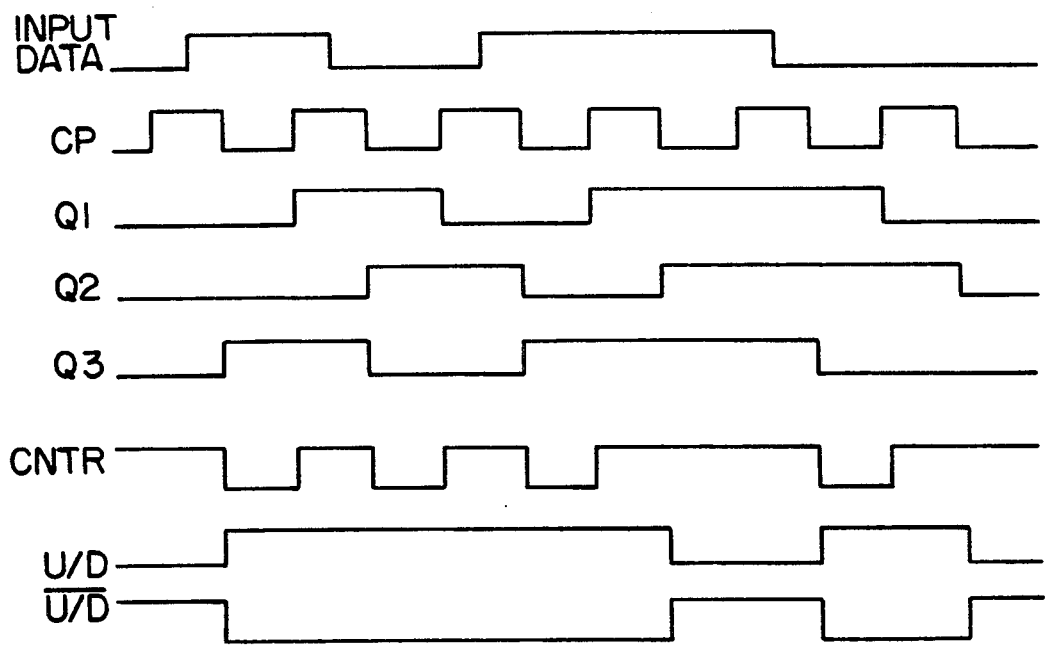

Secondly, the lower diagram FIG. 2B shows the case where the transited position of the clock pulse from the VCO or the phase-controlled circuit is retarded relative to the center of the unit bit interval of the NRZ data, that is, where the rising edge of the retiming non-inverted clock pulse occurs after the center of the unit bit interval of the NRZ data. At this time, there is a phase discrepancy, equal to a duration of the retiming clock pulses, between the data from the output Q2 of the D-type flip-flop U2 retimed with non-inverted phase clock pulses and then retimed again with inverted phase clock pulses and the data from the output Q3 of the D-type flip-flop U3 retimed with the inverted phase clock pulses. Accordingly, the exclusive OR-output U/D from the exclusive OR-or NOR-gate U5 maintains "1" logic level corresponing to the above phase discrepancy. On the other hand, the phase discrepancy between the data from the output Q1 of the D-type flip-flop U1 retimed with the non-inverted phase clock pulses and the data from the output Q3 of the D-type flip-flop U3 retimed with the inverted phase clock pulses is always one-half a duration of the retiming clock pulses. Accordingly, the exclusive NOR-gate U6 produces "0" logic level pulses with a period interval equal to one-half duration of the retiming clock pulses. The transition of this count pulse CNTR occurs at the center of the above-mentioned two data.

Therefore, when the transition phase of the retiming clock pulses is advanced relative to the phase of the center of the unit bit interval of the NRZ data, the rising edge occurs at the output CNTR from the exclusive NOR-gate U6 as the exclusive OR-output U/D from the exclusive OR-or NOR-gate U5 indicates "0" logic level. As a result, it can be found that the transition phase of the retiming clock pulses is advanced relative to the phase of the center of the unit bit interval of the NRZ data. Otherwise, when the transition phase of the retiming clock pulses is retarded relative to the phase of the center of the unit bit interval of the NRZ data, the rising edge occurs at the output CNTR from the exclusive OR-or NOR-gate U6 as the exclusive OR-output U/D from the exclusive OR-or NOR-gate U5 indicates "1" logic level. As a result, it can be found that the transition phase of the retiming clock pulses is retarded relative to the phase of the center of the unit bit interval of the NRZ data. Thus, the phase information can be digitally counted.

Figure 3:
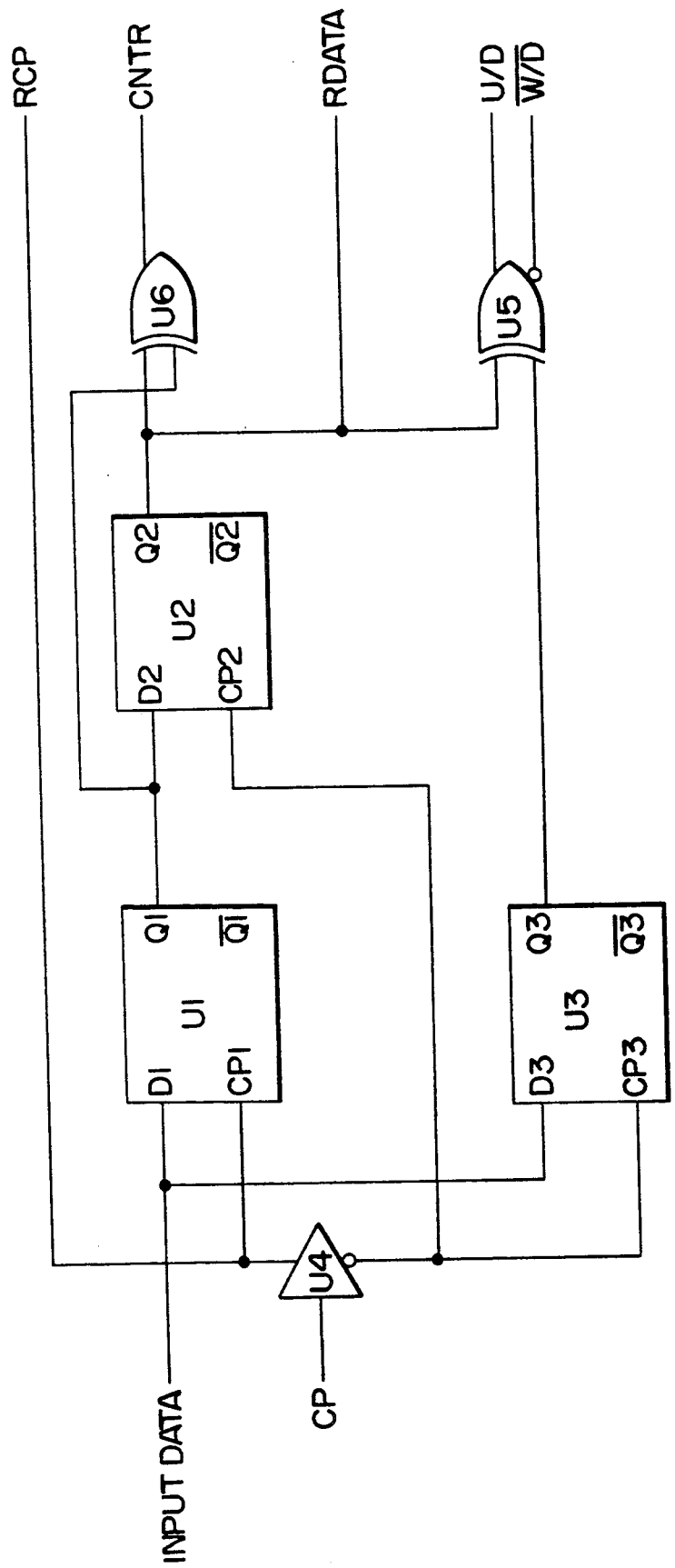
FIG. 3 is a circuit diagram in accordance with another embodiment of the present invention.

Referring to FIG. 3, there is shown a digital phase detector for bit synchronism utilizing emitter-coupled logic (ECL), in accordance with another embodiment of the present invention. The timing diagram of this digital phase detector is similar to that of the digital phase detector according to the embodiment shown in FIG. 1. However, the digital phase detector of FIG. 3, has a drawback of instably operating a specific moment, other than that of FIG. 1. That is, when the transition phase of the retiming clock pulses is the same as the rising edge of the received data, the former disital phase detector can not detect the phase due to the setup time and the hold time of flip-flops. As apparent from the above description, the present invention uses simple logic elements in order to digitally control the clock pulses for bit synchronism. The digital phase detector of the present invention can be used in lieu of the conventional phase detectors and provides the following specific effects:

First, unrestricting the bit speed of the received data, thereby being usable as a phase detector of a retiming circuit for bit synchronism in transmitting data at both low and high speeds;

Secondly, enabling the constitution of the circuit for bit synchronism to be simplified, in virtue of the fact that the output from the phase detector occurs digitally and in the form of being easily matched with a counter of an outer phase detector;

Thirdly, enabling the integration, in virtue of the constitution of simple and standard logic elements; and Finally, driving stable output waveforms in virtue of the fact that the received data is retimed to drive output waveforms.

What is claimed is:

1. A digital phase detector in an NRZ bit synchronous system including a source of NRZ data and a clock for generating clock pulses, said detector producing a logic signal indicative of a phase discrepancy between a phase of the center of an input NRZ data unit bit interval and a transition phase of an input clock pulse having a period equal to the unit bit interval of the NRZ data, said detector comprising:

pulse means for producing non-inverted phase clock pulses and inverted phase clock pulses from the input clock pulses received from the clock;

a first D-type flip-flop having a first D input, a first clock input and a first logic output, said first D input being coupled to said NRZ data source to receive said input NRZ data and said first clock input being coupled to said pulse means to receive said non-inverted phase clock pulses;

a second D-type flip-flop having a second D input, a second clock input and a second logic output, said second D input being coupled to said NRZ data source to receive said input NRZ data and said second clock input being coupled to said pulse means to receive said inverted phase clock pulses;

a third D-type flip-flop having a third D input, a third clock input and a third logic output, said third D input being coupled to said first logic output and said third clock input being coupled to said pulse means to receive said inverted phase clock pulses;

a combination exclusive OR/NOR gate, for outputting a logic signal indicative of the phase discrepancy between a phase of the center of the input NRZ data unit bit interval and the transition phase of the input clock pulse, having a first input, a second input, a logic output and a logic complementary output, said first input being coupled to said third logic output and said second input being coupled to said second logic output; and an exclusive NOR gate, for outputting a logic signal indicative of a phase discrepancy between said first and said second logic outputs, having a first XNOR input, a second XNOR input, and an XNOR logic output, said first XNOR input being coupled to said first logic output and said second XNOR input being coupled to said second logic output.

2. A digital phase detector in an NRZ bit synchronous system including a source of NRZ data and a clock for generating clock pulses, said detector producing a logic signal indicative of a phase discrepancy between a phase of the center of an input NRZ data unit bit interval and a transition phase of an input clock pulse having a period equal to the unit bit interval of the NRZ data, said detector comprising:

pulse means for producing non-inverted phase clock pulses and inverted phase clock pulses from the input clock pulses received from the clock;

a first D-type flip-flop having a first D input, a first clock input and a first logic output, said first D input being coupled to said NRZ data source to receive said input NRZ data and said first clock input being coupled to said pulse means to receive said non-inverted phase clock pulses;

a second D-type flip-flop having a second D input, a second clock input and a second logic output, said second D input being coupled to said NRZ data source to receive said input NRZ data and said second clock input being coupled to said pulse means to receive said inverted phase clock pulses;

a third D-type flip-flop having a third D input, a third clock input and a third logic output, said third D input being coupled to said first logic output and said third clock input being coupled to said pulse means to receive said inverted phase clock pulses;

a combination exclusive OR/NOR gate, for outputting a logic signal indicative of the phase discrepancy between a phase of the center of the input NRZ data unit bit interval and the transition phase of the input clock pulse, having a first input, a second input, a logic output and a logic complementary output, said first input being coupled to said third logic output and said second input being coupled to said second logic output; and an exclusive OR gate for outputting a logic signal indicative of a phase discrepancy between said first and said third logic outputs, having a first XOR input, a second XOR input, and an XOR logic output, said first XOR input being coupled to said third logic output and said second XOR input being coupled to said first logic output.

* * * * *